(12) United States Patent
Zhang et al.

(10) Patent No.: US 10,748,485 B2
(45) Date of Patent: Aug. 18, 2020

(54) PIXEL CIRCUIT, DISPLAY PANEL, DISPLAY DEVICE AND DRIVING METHOD (71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Kai Zhang, Beijing (CN); Yi Zhang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 158 days.

(21) Appl. No.: 15/557,691

(22) PCT Filed: Apr. 12, 2017

(86) PCT No.: PCT/CN2017/080238
§ 371 (c)(1),
(2) Date: Sep. 12, 2017

(87) PCT Pub. No.: WO2018/045749
PCT Pub. Date: Mar. 15, 2018

(65) Prior Publication Data
US 2018/0308427 A1 Oct. 25, 2018

(30) Foreign Application Priority Data
Sep. 8, 2016 (CN) .......................... 2016 1 0811616

(51) Int. Cl.
G09G 3/3258 (2016.01)
G09G 3/3291 (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC ......... G09G 3/3233; G09G 2300/0819; G09G 2320/043; G09G 2320/0233; G09G 2320/045; G09G 3/3258; G09G 2300/0809
See application file for complete search history.

(56) References Cited

U.S. PATENT DOCUMENTS 9,460,662 B2 * 10/2016 Lee ........................ G09G 3/3233
9,576,532 B2 * 2/2017 Lee ........................ G09G 3/3233
(Continued)

FOREIGN PATENT DOCUMENTS

CN 102349098 A 2/2012
CN 103123773 A 5/2013
(Continued)

OTHER PUBLICATIONS

The First Chinese Office Action dated Feb. 11, 2018; Appln. No. 201610811616.6.
(Continued)

*Primary Examiner* — Bryan Earles (57) ABSTRACT

A pixel circuit, a display panel, a display device and a driving method. The pixel circuit includes: a storage capacitor, including a first terminal connected with a first node, and a second terminal connected with a reference voltage line to receive a reference voltage; an organic light-emitting diode; a driving transistor, configured to control light emission of the organic light-emitting diode according to a voltage of the first node; a first reset circuit, configured to supply an initial voltage to the first node in response to a reset signal; a scanning circuit, configured to supply a data signal to a third
(Continued)

node in response to a scanning signal; a compensating circuit, configured to supply a compensating voltage to the first node responsive to the scanning signal; and a light emission control circuit, configured to control the organic light-emitting diode to emit light responsive to a light emission control signal.

17 Claims, 5 Drawing Sheets

(51) Int. Cl.
  *H01L 27/32*  (2006.01)
  *H01L 27/12*  (2006.01)
  *H01L 51/52*  (2006.01)
  *G09G 3/3233*  (2016.01)
  *G09G 3/3266*  (2016.01)

(52) U.S. Cl.
  CPC ......... *G09G 3/3291* (2013.01); *H01L 27/124* (2013.01); *H01L 27/3265* (2013.01); *H01L 27/3276* (2013.01); *H01L 51/5206* (2013.01); *H01L 51/5221* (2013.01); *G09G 2300/0814* (2013.01); *G09G 2300/0819* (2013.01); *G09G 2310/0264* (2013.01); *G09G 2320/045* (2013.01)

(56) References Cited

U.S. PATENT DOCUMENTS

| | | | | |
|---|---|---|---|---|
| 9,728,128 | B2* | 8/2017 | Li | G09G 3/3233 |
| 10,170,038 | B2* | 1/2019 | Jeon | G09G 3/3233 |
| 2006/0267885 | A1 | 11/2006 | Kwak et al. | |
| 2009/0108763 | A1* | 4/2009 | Han | G09G 3/3233 |
| | | | | 315/169.3 |
| 2011/0164071 | A1* | 7/2011 | Chung | G09G 3/3208 |
| | | | | 345/690 |
| 2011/0193855 | A1* | 8/2011 | Han | G09G 3/3233 |
| | | | | 345/214 |
| 2012/0001893 | A1* | 1/2012 | Jeong | G09G 3/3233 |
| | | | | 345/213 |
| 2012/0199854 | A1* | 8/2012 | Noguchi | H01L 27/3276 |
| | | | | 257/88 |
| 2012/0242643 | A1 | 9/2012 | Ono | |
| 2014/0049531 | A1 | 2/2014 | Kwak | |
| 2015/0187270 | A1* | 7/2015 | Lee | G09G 3/3233 |
| | | | | 345/76 |
| 2016/0035283 | A1* | 2/2016 | Park | G09G 3/3258 |
| | | | | 345/214 |
| 2016/0189610 | A1 | 6/2016 | Xiao et al. | |
| 2017/0169764 | A1* | 6/2017 | Lee | G09G 3/3291 |
| 2018/0061318 | A1 | 3/2018 | Yin et al. | |

FOREIGN PATENT DOCUMENTS

| | | |
|---|---|---|
| CN | 104464643 A | 3/2015 |
| CN | 104575377 A | 4/2015 |
| CN | 204680360 U | 9/2015 |
| CN | 105609049 A | 5/2016 |
| CN | 105679236 A | 6/2016 |
| CN | 106128360 A | 11/2016 |
| JP | 2016/042195 A | 6/2016 |
| KR | 1020090048823 A | 5/2009 |
| WO | 2016/045261 A1 | 3/2016 |

OTHER PUBLICATIONS

International Search Report and Written Opinion dated Jun. 1, 2017; PCT/CN2017/080238.

Extended European Search Report dated Feb. 13, 2020; Appln. No. 17761176.1.

* cited by examiner

PIXEL CIRCUIT, DISPLAY PANEL, DISPLAY DEVICE AND DRIVING METHOD

TECHNICAL FIELD

Embodiments of the present disclosure relate to a pixel circuit, a display panel, a display device, and a driving method.

BACKGROUND

In a field of display, organic light-emitting diode (OLED) display panels have a broad development prospect due to characteristics such as self-illumination, high contrast, low power consumption, a wide viewing angle, fast response, capability of being used in a flexible panel, a wide usage temperature range, simplicity in fabrication, and so on. Due to the above-described characteristics, the organic light-emitting diode (OLED) display panels may be applied on mobile phones, monitors, laptops, digital cameras, instruments and other devices having a display function.

SUMMARY

Embodiments of the disclosure provide a pixel circuit, comprising: a storage capacitor, including a first terminal and a second terminal, wherein the first terminal is connected with a first node, and the second terminal is connected with a reference voltage line to receive a reference voltage; an organic light-emitting diode, including an anode and a cathode, wherein the anode is connected with a second node, and the cathode is connected with a second power line to receive a second voltage; a driving transistor, including a gate electrode connected with the first node, wherein the driving transistor is configured to control light emission of the organic light-emitting diode according to a voltage of the first node; a first reset circuit, configured to supply an initial voltage to the first node in response to a reset signal; a scanning circuit, configured to supply a data signal to a third node in response to a scanning signal; a compensating circuit, configured to supply a compensating voltage to the first node in response to the scanning signal, wherein the compensating voltage is a sum of the data signal and a threshold voltage of the driving transistor; and a light emission control circuit, configured to control the organic light-emitting diode to emit light in response to a light emission control signal.

For example, in the pixel circuit provided in embodiments of the disclosure, the light emission control circuit includes: a first light emission control circuit, configured to supply a first voltage of a first power line to a fourth node in response to the light emission control signal; and a second light emission control circuit, configured to conduct the third node and the second node in response to the light emission control signal.

For example, in the pixel circuit provided in embodiments of the disclosure, at least one of the first reset circuit, the scanning circuit, the compensating circuit and the light emission control circuit includes a transistor.

For example, in the pixel circuit provided in embodiments of the disclosure, the first reset circuit includes a first transistor, a first electrode of the first transistor is connected with an initial signal line to receive the initial voltage, a gate electrode of the first transistor is connected with a reset signal line to receive the reset signal, and a second electrode of the first transistor is connected with the first node; the compensating circuit includes a second transistor, a first electrode of the second transistor is connected with the first node, a gate electrode of the second transistor is connected with a scanning signal line to receive the scanning signal, and a second electrode of the second transistor is connected with the fourth node; the scanning circuit includes a fourth transistor, a first electrode of the fourth transistor is connected with a data signal line to receive the data signal, a gate electrode of the fourth transistor is connected with the scanning signal line to receive the scanning signal, and a second electrode of the fourth transistor is connected with the third node; and a first electrode of the driving transistor is connected with the fourth node, a gate electrode of the driving transistor is connected with the first node, and a second electrode of the driving transistor is connected with the third node.

For example, in the pixel circuit provided in embodiments of the disclosure, the first light emission control circuit includes a fifth transistor, a first electrode of the fifth transistor is connected with the first power line to receive the first voltage, a gate electrode of the fifth transistor is connected with a light emission control signal line to receive the light emission control signal, and a second electrode of the fifth transistor is connected with the fourth node; and the second light emission control circuit is a sixth transistor, a first electrode of the sixth transistor is connected with the third node, a gate electrode of the sixth transistor is connected with the light emission control signal line to receive the light emission control signal, and a second electrode of the sixth transistor is connected with the second node.

For example, the pixel circuit provided in embodiments of the disclosure further comprises a second reset circuit, configured to supply the initial voltage to the second node in response to the reset signal.

For example, in the pixel circuit provided in embodiments of the disclosure, at least one of the first reset circuit, the scanning circuit, the second reset circuit and the compensating circuit includes a transistor; and the light emission control circuit includes a fifth transistor and a sixth transistor.

For example, in the pixel circuit provided in embodiments of the disclosure, the first reset circuit includes a first transistor, a first electrode of the first transistor is connected with an initial signal line to receive the initial voltage, a gate electrode of the first transistor is connected with a reset signal line to receive the reset signal, and a second electrode of the first transistor is connected with the first node; the compensating circuit includes a second transistor, a first electrode of the second transistor is connected with the first node, a gate electrode of the second transistor is connected with a scanning signal line to receive the scanning signal, and a second electrode of the second transistor is connected with the fourth node; the scanning circuit includes a fourth transistor, a first electrode of the fourth transistor is connected with a data signal line to receive the data signal, a gate electrode of the fourth transistor is connected with the scanning signal line to receive the scanning signal, and a second electrode of the fourth transistor is connected with the third node; the first electrode of the driving transistor is connected with the fourth node, the gate electrode of the driving transistor is connected with the first node, and the second electrode of the driving transistor is connected with the third node; the second reset circuit includes a seventh transistor, a first electrode of the seventh transistor is connected with the initial signal line to receive the initial voltage, a gate electrode of the seventh transistor is connected with the reset signal line to receive the reset signal, and a second electrode of the seventh transistor is connected with the second node; a first electrode of the fifth transistor is connected with the first power line to receive the first voltage, a gate electrode of the fifth transistor is connected with the light emission control signal line to receive the light emission control signal, and a second electrode of the fifth transistor is connected with the fourth node; and a first electrode of the sixth transistor is connected with the third node, a gate electrode of the sixth transistor is connected with the light emission control signal line to receive the light emission control signal, and a second electrode of the sixth transistor is connected with the second node.

For example, in the pixel circuit provided in embodiments of the disclosure, the first transistor, the second transistor, the driving transistor, the fourth transistor, the fifth transistor, the sixth transistor and the seventh transistor are all P-type transistors.

For example, in the pixel circuit provided in embodiments of the disclosure, the first transistor, the second transistor, the driving transistor, the fourth transistor, the fifth transistor, the sixth transistor and the seventh transistor are all thin film transistors.

Embodiments of the disclosure further provide a display panel, comprising the pixel circuit described above. The display panel further comprises: a first power line, for supplying a first voltage; a second power line, for supplying a second voltage; a reference voltage line, a data signal line, a reset signal line, and a scanning signal line, wherein the data signal line and the reset signal line are arranged to extend across each other, the data signal line and the scanning signal line are arranged to extend across each other, and the reference voltage line is parallel to at least one of the data signal line, the reset signal line and the scanning signal line; a scan driving circuit, configured to supply the scanning signal to a scanning signal line; and a data driving circuit, configured to supply the data signal to a data signal line.

Embodiments of the disclosure further provide a display device, comprising the display panel described above.

Embodiments of the disclosure further provide a driving method of the pixel circuit described above, comprising a reset stage, a data write and threshold compensation stage and a light emission stage, wherein: in the reset stage, a light emission control signal is set to a turning-off voltage, a reset signal is set to a turning-on voltage, a scanning signal is set to the turning-on voltage, and a data signal is set to an invalid data signal; in the data write and threshold compensation stage, the light emission control signal is set to the turning-off voltage, the reset signal is set to the turning-off voltage, the scanning signal is set to the turning-on voltage, and the data signal is set to a valid data signal; and in the light emission stage, the light emission control signal is set to the turning-on voltage, the reset signal is set to the turning-off voltage, the scanning signal is set to the turning-off voltage, and the data signal is set to the invalid data signal.

For example, the driving method provided in embodiments of the disclosure further comprises a pre-reset stage prior to the reset stage; wherein in the pre-reset stage, the light emission control signal is set to the turning-off voltage, the reset signal is set to the turning-off voltage, the scanning signal is set to the turning-off voltage, and the data signal is set to the invalid data signal.

For example, the driving method provided in embodiments of the disclosure further comprises a signal write preparation stage between the reset stage and the data write and threshold compensation stage; wherein in the signal write preparation stage, the light emission control signal is set to the turning-off voltage, the reset signal is set to the turning-off voltage, the scanning signal is set to the turning-off voltage, and the data signal is set to the invalid data signal.

For example, the driving method provided in embodiments of the disclosure further comprises a pre-emission stage between the data write and threshold compensation stage and the light emission stage; wherein in the pre-emission stage, the scanning signal is set to the turning-off voltage, the reset signal is set to the turning-off voltage, the data signal is set to the invalid data signal, and the light emission control signal is set to the turning-off voltage.

BRIEF DESCRIPTION OF THE DRAWINGS

In order to illustrate the technical solutions in the embodiments of the present disclosure more clearly, the drawings needed to be used in the description of the embodiments will be briefly described in the following. It is obvious that the drawings described below are only related to some embodiments of the present disclosure, and are not intended to be limitative to the disclosure.

DETAILED DESCRIPTION

Hereinafter, the technical solutions of the embodiments of the present disclosure will be described in a clearly and fully understandable way in conjunction with the drawings related to the embodiments of the present disclosure; with reference to non-restrictive exemplary embodiments shown in the drawings and described in detail in the following description, exemplary embodiments of the present disclosure and their various features and favorable details are illustrated more comprehensively. It should be noted that, the features shown in the drawings are not necessarily drawn according to scale. Known materials, components and process technologies are not described in the present disclosure so as not to obscure the exemplary embodiments of the present disclosure. Examples given are merely intended to facilitate understanding of implementation of exemplary embodiments of the present disclosure, and further enable those skilled in the art to implement the exemplary embodiments. Therefore, the examples should not be construed as limiting the scope of the exemplary embodiments of the present disclosure.

Unless otherwise defined, technical terms or scientific terms used in the present disclosure should be of general meaning as understood by those ordinarily skilled in the art. "First", "second" and similar words used in the present disclosure do not represent any sequence, quantity or importance and merely intend to differentiate different composite parts. In addition, in respective embodiments of the present disclosure, same or similar reference signs denote same or similar parts.

In an organic light-emitting diode (OLED) display panel, there is a resistance voltage drop (IR drop) phenomenon. The IR drop is caused by self-resistance voltage division of a wire in the display panel, that is, when a current passes through the wire (for example, a power supply line) in the display panel, a certain voltage drop will occur on the wire according to Ohm's law. As a result, pixel units at different locations are affected by the IR drop to different extents, which results in unevenness of display of the display panel. Therefore, it is needed to compensate the IR drop in the OLED display panel. In the OLED display panel, threshold voltages of driving transistors in respective pixel units may be different from each other due to manufacture processes; and due to, for example, influence of change of temperature, the threshold voltages of the driving transistors may also drift. Therefore, difference in the threshold voltages of the respective driving transistors may also result in unevenness of display of the display panel. Therefore, it is also needed to compensate the threshold voltages of the driving transistors.

In addition, with improvement of resolution of a display device, increment in the number of pixels causes wiring of the display device to be more compact, resulting in increased signal-to-signal coupling crosstalk. In a pixel circuit, one terminal of a storage capacitor stores a data signal, and the other terminal of the storage capacitor is connected with a certain reference voltage in the circuit. For example, one terminal of the storage capacitor is generally connected with a power supply line of the organic light-emitting diode or an output terminal of a certain thin film transistor to obtain the reference voltage, and so, when the IR drop is more noticeable, the reference voltage of the storage capacitor may become unstable. At this point, if the reference voltage is also associated with the thin film transistor, a switching process of the thin film transistor is also apt to cause fluctuation of the reference voltage. The fluctuation of the reference voltage may further cause change in the data signal stored in the storage capacitor, resulting in occurrence of crosstalk or mura and other undesirable phenomena in display.

Embodiments of the present disclosure provide a pixel circuit, a display panel, a display device and a driving method. By technical solutions provided by the embodiments of the present disclosure, a storage capacitor is connected with an independent and unaffected reference voltage, and thus, accuracy and stability of the data signal stored in the storage capacitor is increased. Further, in the embodiments of the present disclosure, a driving transistor can be implemented as a diode-conduction approach, which compensates the threshold voltage of the driving transistor, so as to eliminate the phenomenon of mura of the organic light-emitting diode caused by threshold voltage drift of the driving transistor. In addition, in the embodiments of the present disclosure, a separate thin film transistor is used in a reset stage of the circuit for discharging of an organic light-emitting diode anode, which avoids abnormal light emission of the organic light-emitting diode.

Figure 1:
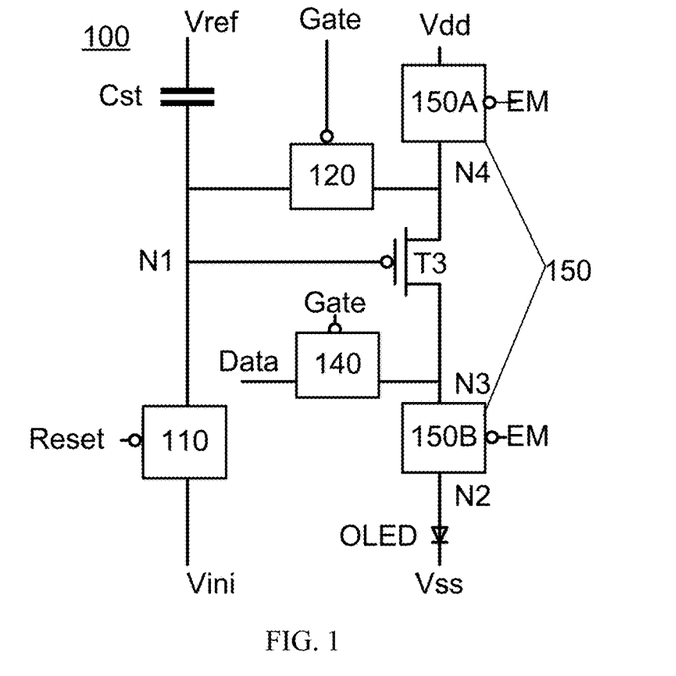
FIG. 1 is a first schematic Diagram of a pixel circuit provided by an embodiment of the present disclosure.

An embodiment of the present disclosure provides a pixel circuit 100. As shown in FIG. 1, the pixel circuit 100 comprises: a storage capacitor Cst, a first reset circuit 110, a compensating circuit 120, a driving transistor T3, a scanning circuit 140, a light emission control circuit 150, and an organic light-emitting diode (OLED).

For example, as shown in FIG. 1, the storage capacitor Cst includes a first terminal and a second terminal, the first terminal being connected with a first node N1 and a second terminal being connected with a reference voltage line to receive a reference voltage Vref. The organic light-emitting diode (OLED) includes an anode and a cathode, the anode being connected with the second node N2, and the cathode being connected with a second power line to receive a second voltage Vss. The driving transistor T3 includes a gate electrode connected with the first node N1, and the driving transistor T3 is configured to be turned on or off according to a voltage of the first node N1, so as to control the organic light-emitting diode (OLED) to emit light. The first reset circuit 110 is connected with the first node N1, and is configured to supply an initial voltage Vini to the first node N1 in response to a reset signal Reset. The scanning circuit 140 is configured to supply a data signal Data to a third node N3 in response to a scanning signal Gate. The compensating circuit 120 is connected between the first node N1 and a fourth node N4, and is configured to supply a compensating voltage to the first node N1 in response to the scanning signal Gate. The compensating voltage may be a sum of the data signal Data and a threshold voltage Vth of the driving transistor, e.g., "Data+Vth". The light emission control circuit 150 may be configured to control the organic light-emitting diode (OLED) to emit light in response to a light emission control signal EM.

For example, as shown in FIG. 1, the light emission control circuit 150 may include: a first light emission control circuit 150A and a second light emission control circuit 150B. The first light emission control circuit 150A is configured to supply a first voltage Vdd of a first power line to the fourth node N4 in response to the light emission control signal EM. The second light emission control circuit 150B is configured to conduct the third node N3 to the second node N2 (for example, to supply a voltage of the third node N3 to the second node N2) in response to the light emission control signal EM.

For example, the first reset circuit 110, the scanning circuit 140, the compensating circuit 120, the first light emission control circuit 150A, and the second light emission control circuit 150B may be at least implemented by using transistors.

Figure 2:
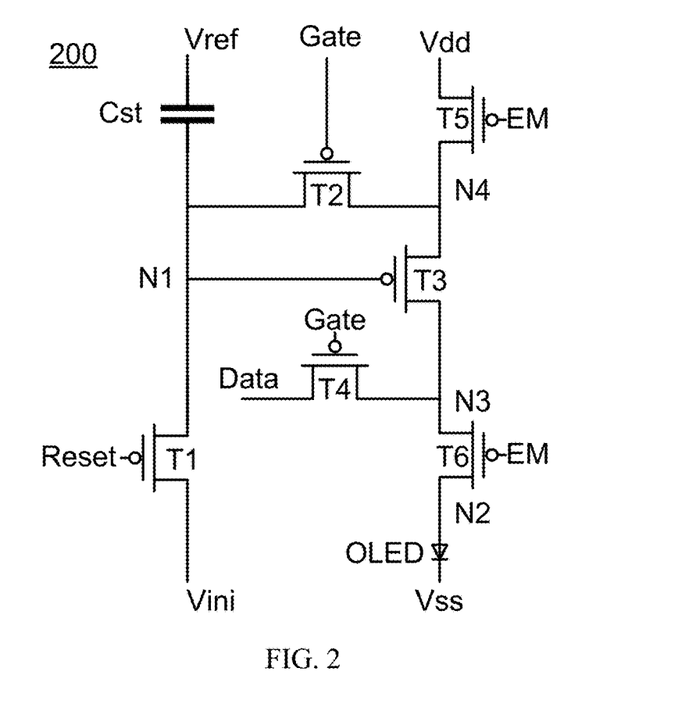
FIG. 2 is a second schematic Diagram of a pixel circuit provided by an embodiment of the present disclosure.

FIG. 2 provides an example in which the first reset circuit 110, the scanning circuit 140, the compensating circuit 120, the first light emission control circuit 150A, and the second light emission control circuit 150B are all transistors.

For example, as shown in FIG. 1 and FIG. 2, the first reset circuit 110 includes a first transistor T1, a first electrode of the first transistor T1 is connected with an initial signal line to receive the initial voltage Vini, a gate electrode of the first transistor T1 is connected with a reset signal line to receive the reset signal Reset, and a second electrode of the first transistor T1 is connected with the first node N1. The compensating circuit 120 includes a second transistor T2, a first electrode of the second transistor T2 is connected with the first node N1, a gate electrode of the second transistor T2 is connected with a scanning signal line to receive the scanning signal Gate, and a second electrode of the second transistor T2 is connected with the fourth node N4. The scanning circuit 140 includes a fourth transistor T4, a first electrode of the fourth transistor T4 is connected with the data signal line to receive the data signal Data, a gate electrode of the fourth transistor T4 is connected with the scanning signal to receive the scanning signal Gate, and a second electrode of the fourth transistor T4 is connected with the third node N3. A first electrode of the driving transistor T3 is connected with the fourth node N4, a gate electrode of the driving transistor T3 is connected with the first node N1, and a second electrode of the driving transistor T3 is connected with the third node N3.

For example, as shown in FIG. 2, the first light emission control circuit 150A includes a fifth transistor T5, a first electrode of the fifth transistor T5 is connected with a first power line to receive the first voltage Vdd, a gate electrode of the fifth transistor T5 is connected with a light emission control signal line to receive the light emission control signal EM, and a second electrode of the fifth transistor T5 is connected with the fourth node N4. The second light emission control circuit 150B includes a sixth transistor T6, a first electrode of the sixth transistor T6 is connected with the third node N3, a gate electrode of the sixth transistor T6 is connected with the light emission control signal line to receive the light emission control signal EM, and a second electrode of the sixth transistor T6 is connected with the second node N2.

For example, the pixel circuit shown in FIG. 1 or FIG. 2 receives an independent and unaffected reference voltage Vref by connecting the storage capacitor Cst with the reference voltage line, which ensures accuracy and stability of the data signal stored in the storage capacitor Cst. In addition, the pixel circuit shown in FIG. 2 may also compensate for change of the threshold voltage of the driving transistor T3, so as to mitigate or eliminate a mura issue of the organic light-emitting diode caused by threshold voltage offset of the driving transistor.

Figure 3:
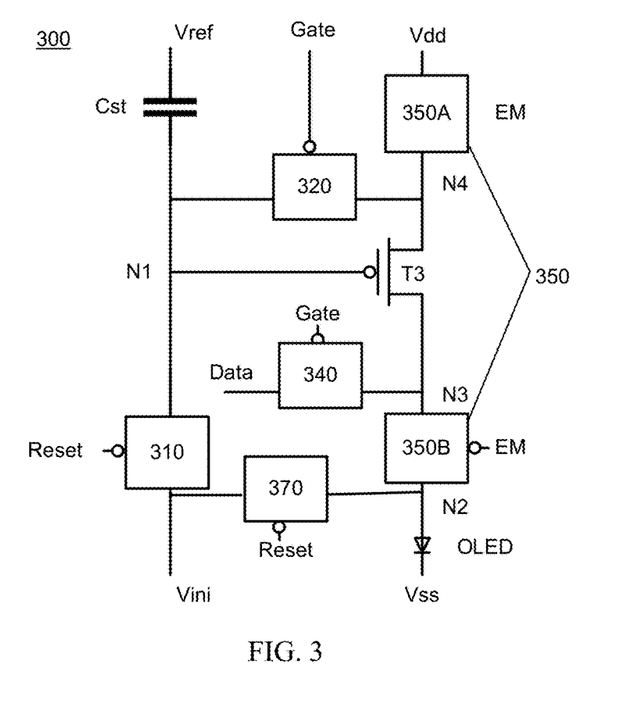
FIG. 3 is a third schematic Diagram of a pixel circuit provided by an embodiment of the present disclosure.

For example, FIG. 3 shows a pixel circuit 300, and the pixel circuit 300 differs from the pixel circuit 100 provided by FIG. 1 in that the pixel circuit shown in FIG. 3 has an additional second reset circuit 370. With reference to FIG. 3, it can be seen that the pixel circuit 300 not only comprises the storage capacitor Cst, the first reset circuit 310, the compensating circuit 320, the driving transistor T3, the scanning circuit 340, the light emission control circuit 350, and the organic light-emitting diode (OLED), but also comprises a second reset circuit 370. The second reset circuit 370 is configured to supply the initial voltage Vini to the second node N2 in response to the reset signal.

For example, the first reset circuit 310, the scanning circuit 340, the second reset circuit 370 and the compensating circuit 320 may be at least implemented by transistors. In addition, the light emission control circuit 350 may include a fifth transistor and a sixth transistor.

Figure 4:
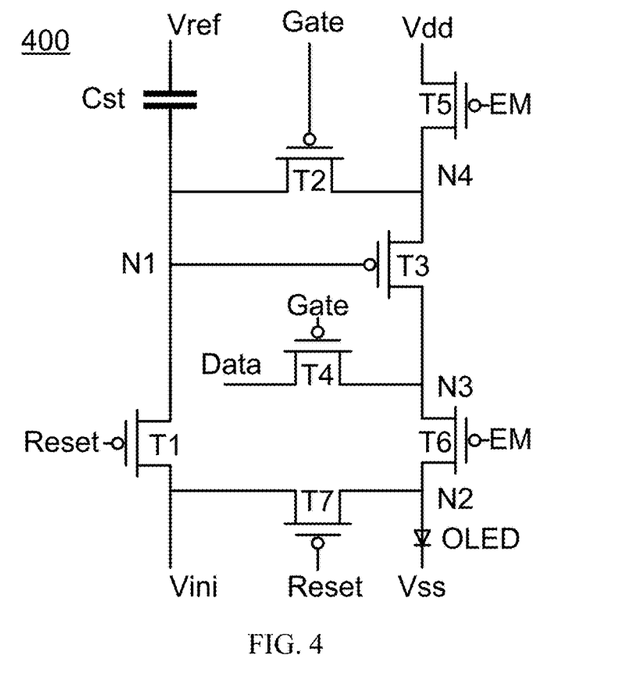
FIG. 4 is a fourth schematic Diagram of a pixel circuit provided by an embodiment of the present disclosure.

For example, FIG. 4 is an example of the pixel circuit shown in FIG. 3. In the pixel circuit 400 shown in FIG. 4, the first reset circuit 310 includes the first transistor T1, the first electrode of the first transistor T1 is connected with the initial signal line to receive the initial voltage Vini, the gate electrode of the first transistor T1 is connected with the reset signal line to receive the reset signal Reset, and the second electrode of the first transistor T1 is connected with the first node N1. The compensating circuit 320 includes the second transistor T2, the first electrode of the second transistor T2 is connected with the first node N1, the gate electrode of the second transistor T2 is connected with the scanning signal line to receive the scanning signal Gate, and the second electrode of the second transistor T2 is connected with the fourth node N4. The scanning circuit 340 shown in FIG. 3 includes the fourth transistor T4, the first electrode of the fourth transistor T4 is connected with the data signal line to receive the data signal Data, the gate electrode of the fourth transistor T4 is connected with the scanning signal to receive the scanning signal Gate, and the second electrode of the fourth transistor T4 is connected with the third node N3. The first electrode of the driving transistor T3 is connected with the fourth node N4, the gate electrode of the driving transistor T3 is connected with the first node N1, and the second electrode of the driving transistor T3 is connected with the third node N3. The second reset circuit 370 includes a seventh transistor T7, a first electrode of the seventh transistor T7 is connected with the initial signal line to receive the initial voltage Vini, a gate electrode of the seventh transistor T7 is connected with the reset signal line to receive the reset signal Reset, and a second electrode of the seventh transistor T7 is connected with the second node N2. The first electrode of the fifth transistor T5 is connected with the first power line to receive the first voltage Vdd, the gate electrode of the fifth transistor T5 is connected with the light emission control signal line to receive the light emission control signal EM, and the second electrode of the fifth transistor T5 is connected with the fourth node N4. The first electrode of the sixth transistor T6 is connected with the third node N3, the gate electrode of the sixth transistor T6 is connected with the light emission control signal line to receive the light emission control signal EM, and the second electrode of the sixth transistor T6 is connected with the second node N2.

For example, the first transistor T1, the second transistor T2, the driving transistor T3, the fourth transistor T4, the fifth transistor T5, the sixth transistor T6, and the seventh transistor T7 shown in FIG. 4 are all P-type transistors.

For example, the first transistor T1, the second transistor T2, the driving transistor T3, the fourth transistor T4, the fifth transistor T5, the sixth transistor T6, and the seventh transistor T7 shown in FIG. 4 are all thin film transistors.

For example, the pixel circuit shown in FIG. 3 or FIG. 4 receives the independent and unaffected reference voltage Vref by connecting the storage capacitor Cst with the reference voltage line, which ensures accuracy and stability of the data signal stored in the storage capacitor Cst. In addition, the pixel circuit shown in FIG. 3 or FIG. 4 may also compensate the threshold voltage of the driving transistor T3, so as to mitigate or eliminate mura of the organic light-emitting diode caused by threshold voltage offset of the driving transistor. For example, the pixel circuit shown in FIG. 4 may also discharge an anode of the organic light-emitting diode during circuit initialization by using the seventh transistor T7, so as to avoid abnormal light emission (crosstalk) of the organic light-emitting diode in an initial stage of an image frame.

It should be noted that, all the transistors used in embodiments of the present disclosure may be thin film transistors or field-effect transistors or other switching devices of a same characteristic. A source electrode and a drain electrode of the transistor used here may be symmetrical in structure, so that the source electrode and the drain electrode thereof may have no difference in structure. In embodiments of the present disclosure, in order to distinguish two electrodes other than the gate electrode of the transistor, it is directly described that one electrode therein is the first electrode, and the other electrode is the second electrode. Thus, the first electrode and the second electrode of all or some of the transistors in the embodiments of the present disclosure may be interchangeable according to actual needs. For example, the first electrode of the transistor as described in the embodiments of the present disclosure may be a source electrode, and the second electrode may be a drain electrode; or, the first electrode of the transistor is a drain electrode, and the second electrode is a source electrode. In addition, a transistor may be classified into an N-type transistor or a P-type transistor according to the characteristics of the transistor. In the embodiments of the present disclosure, it is illustrated with a case where the driving transistor T3, the first transistor T1, the second transistor T2, the driving transistor T3, the fourth transistor T4, the fifth transistor T5, the sixth transistor T6 and the seventh transistor T7 are all P-type transistors as an example. Based on description and teachings of the implementations in the present disclosure, those skilled in the art can easily conceive of implementations in which the N-type transistors or a combination of the N-type transistors and the P-type transistors are used according to the embodiments of the present disclosure without any inventive work, which should be within the protection scope of the present disclosure.

Figure 5A:
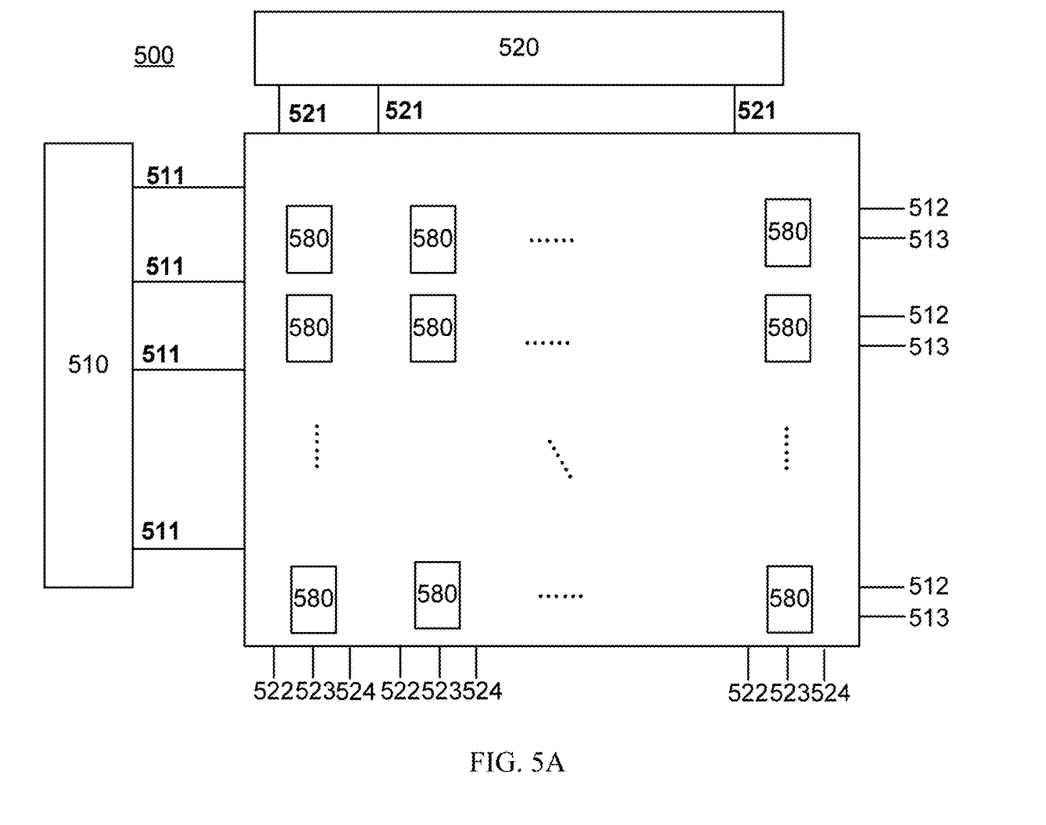
FIG. 5A is a schematic diagram of a display panel provided by an embodiment of the present disclosure.

An embodiment of the present disclosure further provides a display panel 500, and as shown in FIG. 5A, the display panel 500 comprises a plurality of pixel circuits 580 provided by any one of the embodiments of the present disclosure. For example, a pixel circuit 580 may be the pixel circuit shown in any one of FIG. 1 to FIG. 4.

Figure 5B:
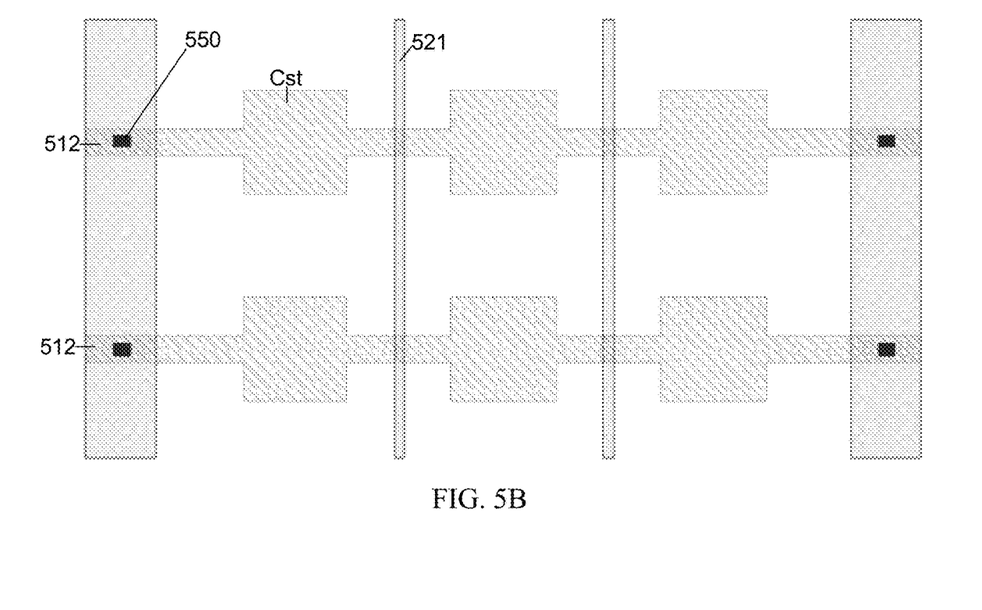
FIG. 5B to FIG. 5D provide three example wiring schematic diagrams with respect to reference voltage lines of the display panel of FIG. 5A.
Figure 5C:
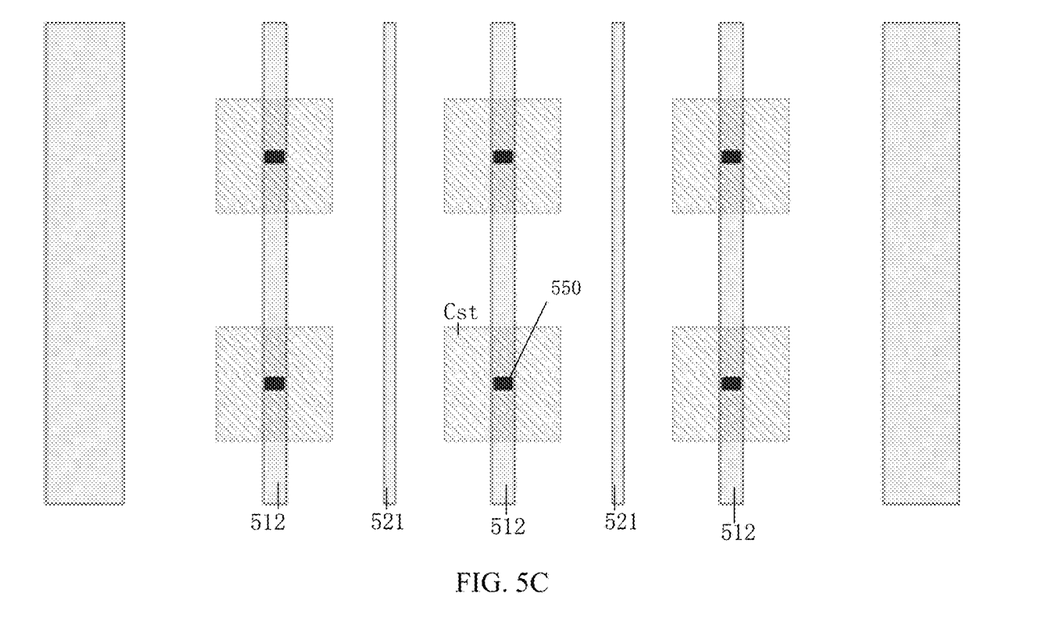
Figure 5D:
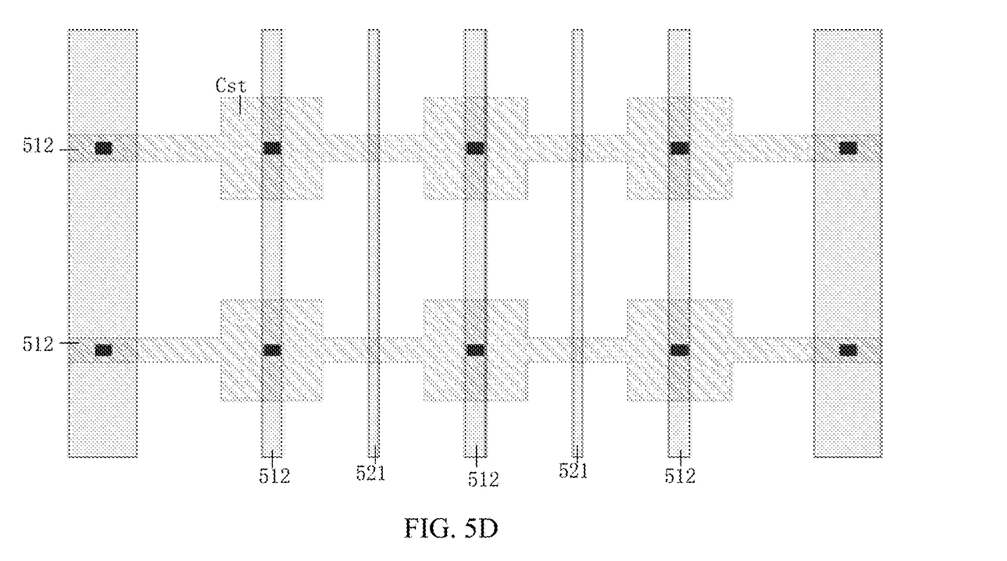

For example, as shown in FIG. 5A, the display panel 500 may further comprise: a scanning signal line 511, a reference voltage line 512, a reset signal line 513, a data signal line 521, a first power line 523 and a second power line 524. The data signal line 521 and the reset signal line 513 extend across each other, and the data signal line 521 and the scanning signal line 511 extend across each other. The reference voltage line 512 is parallel to at least one of the data signal line 521, the reset signal line 513 or the scanning signal line 511 (for example, as shown in FIG. 5A, the reference voltage line 512 is parallel to the reset signal line 513 and the scanning signal line 511). For example, with reference to FIG. 5A, a reference voltage Vref is introduced into a display region of an entire display device by using independent reference voltage lines 512. With reference to FIG. 5B, the reference voltage line 512 may be introduced laterally from both sides of the display region, and the reference voltage line 512 may connect a capacitance plate (e.g., a second terminal of the storage capacitor Cst shown in FIG. 1) of each of all the storage capacitors Cst in pixels of a same row together through a via hole 550, and use the capacitance plate as a portion of a transverse wire of the reference voltage line. For another example, with reference to FIG. 5C, layout of the reference voltage line 512 may also be a longitudinal wire, which is connected with the capacitance plates of the storage capacitors through the via holes 550 to supply the reference voltage Vref to the capacitance plates of all pixels in a same column. Thus, crossover of other signal lines with the reference voltage line 512 is reduced, and signal interference is reduced. In addition, with reference to FIG. 5D, layout of the reference voltage lines 512 may also have both of the above-described connection approaches used at the same time (i.e., both lateral introduction and longitudinal introduction are used at the same time), so as to form a grid-like wiring. With the grid-like wiring, it is possible to provide stable voltage supply, so that the pixel circuits in respective pixel units receive reference voltages Vref that are more approximate to each other, and further the entire display region achieves better evenness. With respect to the wire layout of the reference voltage lines used in an actual application scenario, it is possible to select from the three implementation approaches shown in FIG. 5B, FIG. 5C and FIG. 5D as descried above according to manufacture capability and products. In addition, in the embodiments of the present disclosure, three types of specific wiring approaches of the reference voltage lines are illustrated, and it is not intended to limit embodiments of the disclosure to use only the three types of wiring approaches.

For example, a scan driving circuit 510 shown in FIG. 5A is configured to supply scanning signals Gate to a plurality of scanning signal lines 511. A data driving circuit 520 shown in FIG. 5A may provide the data signals Data to a plurality of data lines 521. The first power line 523 shown in FIG. 5A may be used for providing a first voltage Vdd, and the second power line 524 is used for providing a second voltage Vss. For example, the first voltage Vdd is greater than the second voltage Vss. For example, the second voltage Vss may be a ground voltage.

Figure 6:
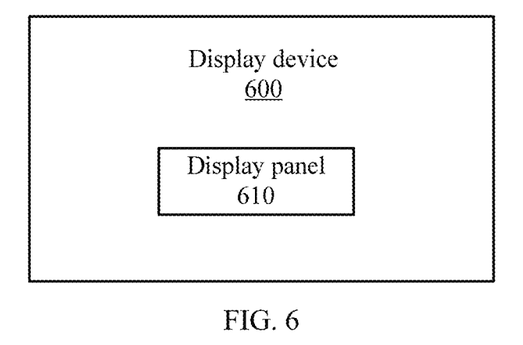
FIG. 6 is a schematic diagram of a display device provided by an embodiment of the present disclosure.

An embodiment of the present disclosure further provides a display device 600. As shown in FIG. 6, the display device 600 comprises a display panel 610. For a specific structure of the display panel 610, the display panel 500 provided by any one of the embodiments of the present disclosure may be referred to. The display device 600 may further comprise a signal processing unit and the like, for performing signal reception, data decoding, and other operations.

For example, the display device provided by the embodiments of the present disclosure may comprise any product or component having a display function, such as a mobile phone, a tablet computer, a television, a monitor, a laptop computer, a digital photo frame, a navigator, etc.

Figure 7:
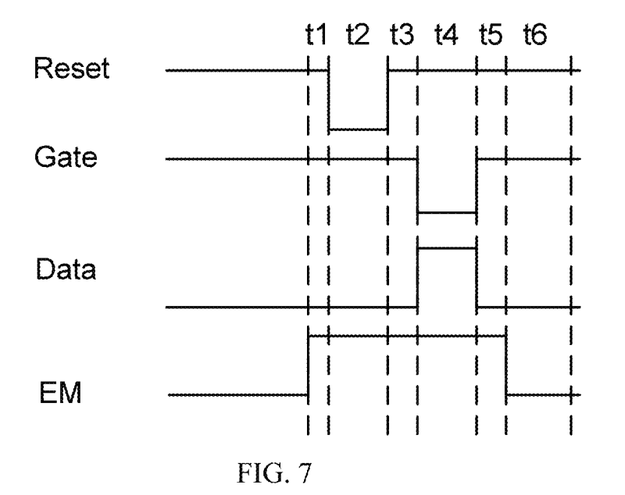
FIG. 7 is an exemplary driving timing chart of the pixel circuit as shown in FIG. 2 or FIG. 4 provided by embodiments of the present disclosure.

An embodiment of the present disclosure further provides a driving method used in the pixel circuit 200 as shown in FIG. 2. For example, as shown in FIG. 7, the driving method may comprise a reset stage t2, a data write and threshold compensation stage t4, and a light emission stage t6.

In the reset stage t2, a light emission control signal EM is set to a turning-off voltage, a reset signal Reset is set to a turning-on voltage, a scanning signal Gate is set to the turning-on voltage, and a data signal Data is set to an invalid data signal.

In the data write and threshold compensation stage t4, the light emission control signal EM is set to the turning-off voltage, the reset signal Reset is set to the turning-off voltage, the scanning signal Gate is set to the turning-on voltage, and the data signal Data is set to a valid data signal.

In the light emission stage t6, the light emission control signal EM is set to the turning-on voltage, the reset signal Reset is set to the turning-off voltage, the scanning signal Gate is set to the turning-off voltage, and the data signal Data is set to the invalid data signal.

For example, the turning-on voltage according to the embodiments of the present disclosure refers to a voltage that enables a first electrode and a second electrode of a corresponding transistor to be conducted, and the turning-off voltage refers to a voltage that enables the first electrode and the second electrode of the corresponding transistor to be disconnected (turned off). When the transistor is a P-type transistor, the turning-on voltage is a low voltage (for example, 0V or other voltages), and the turning-off voltage is a high voltage (for example, 5V or other voltages); when the transistor is an N-type transistor, the turning-on voltage is a high voltage (for example, 5V or other voltages), and the turning-off voltage is a low voltage (for example, 0V or other voltages). Driving waveforms shown in FIG. 7 are all illustrated with the P-type transistors as an example, that is, the turning-on voltage of the corresponding transistor in FIG. 7 is a low voltage (for example, 0V or other voltages), and the turning-off voltage is a high voltage (for example, 5V or other voltages). The invalid data signal is, for example, a low voltage signal (for example, 0 V), and the valid data signal is, for example, a signal including light emission data information; and the valid data signal in FIG. 7 is illustrated with a high voltage signal as an example.

For example, the driving method shown in FIG. 7 may further comprise a pre-reset stage t1, the pre-reset stage t1 being located before the reset stage t2.

For example, in the pre-reset stage t1, the light emission control signal EM is set to the turning-off voltage, the reset signal Reset is set to the turning-off voltage, the scanning signal Gate is set to the turning-off voltage, and the data signal Data is set to the invalid data signal.

For example, the driving method shown in FIG. 7 may further comprise a signal write preparation stage t3, the signal write preparation stage t3 being located between the reset stage t2 and the data write and threshold compensation stage t4.

For example, in the signal write preparation stage t3, the light emission control signal EM is set to the turning-off voltage, the reset signal Reset is set to the turning-off voltage, the scanning signal Gate is set to the turning-off voltage, and the data signal Data is set to the invalid data signal.

For example, the driving method shown in FIG. 7 may further comprise a pre-emission stage t5, the pre-emission stage t5 being located between the data write and threshold compensation stage t4 and the light emission stage t6.

For example, in the pre-emission stage t5, the scanning signal Gate is set to the turning-off voltage, the reset signal Reset is set to the turning-off voltage, the data signal Data is set to the invalid data signal, and the light emission control signal EM is set to the turning-off voltage.

An embodiment of the present disclosure further provides a driving method comprising the above-described six stages, i.e., the pre-reset stage t1, the reset stage t2, the signal write preparation stage t3, the data write and threshold compensation stage t4, the pre-emission stage t5, and the light emission stage t6. Hereinafter, the driving method comprising all the six stages is described, with a case where all the transistors involved are the P-type transistors as an example with reference to FIG. 2 and FIG. 4.

For example, with reference to FIG. 2 and FIG. 7, an embodiment of the present disclosure provides a driving method comprising the above-described six stages used in the pixel circuit 200 of FIG. 2. The driving method comprises the following operations:

In the pre-reset stage t1, the reset signal Reset is at a high level; the scanning signal gate is at a high level; the first transistor T1, the second transistor T2 and the fourth transistor T4 are turned off; the light emission control line EM is at a high level, and at this point, the fifth transistor T5 and the sixth transistor T6 are turned off. The pre-reset stage t1 provides a pixel circuit stabilization process, to prevent the circuit from being abnormal and to prepare for the reset stage.

In the reset stage t2, the reset signal Reset is at a low level; the first transistor T1 is turned on; the scanning signal Gate is maintained at the high level; the second transistor T2 and the fourth transistor T4 are turned off; the light emission control signal EM is maintained at the high level; the fifth transistor T5 and the sixth transistor T6 are turned off; and the initial voltage Vini is transmitted to the first node N1 through the first transistor T1 to reset the first node N1.

In the signal write preparation stage t3, the reset signal Reset is at a high level; the first transistor T1 is turned off; the scanning signal Gate and the light emission control signal EM are maintained at the high level; the first transistor T1, the second transistor T2, the fourth transistor T4, the fifth transistor T5 and the sixth transistor T6 are turned off; the signal write preparation stage t3 provides a pixel circuit stabilization process, to prevent the circuit from being abnormal and to prepare for the data write and threshold compensation stage.

In the data write and threshold compensation stage t4, the reset signal Reset is maintained at the high level; the scanning signal Gate is at a low level; a this point, the second transistor T2 and the fourth transistor T4 are turned on, and the data signal Data is transmitted to the third node N3 through the fourth transistor T4. Since the second transistor T2 is turned on, the gate electrode and the source electrode of the driving transistor T3 are connected with each other, causing the driving transistor T3 to form a diode structure. Since at this point a potential of the first node N1 is the initial voltage Vini (for example, the low level) and the source electrode of the driving transistor T3 is connected with a high-level data signal Data, the driving transistor T3 is in a diode-turing-on state. Due to the threshold voltage of the driving transistor T3 itself being Vth, when the driving transistor T3 is turned on as a diode, the potential of the first node N1 becomes Data+Vth, and then the driving transistor T3 maintains a turning-off state.

In the pre-emission stage t5, the reset signal Reset is maintained at the high level; the scanning signal Gate is at a high level; and at this point, the storage capacitor Cst maintains a voltage at the first node N1 as "Data+Vth". The pre-emission stage t5 provides a pixel circuit stabilization process, to prevent the circuit from being abnormal.

In the light emission stage t6, the reset signal Reset and the scanning signal Gate are maintained at the high level; and at this point, the light emission control signal EM is at a low level, and the fifth signal T5 and the sixth transistor T6 are turned on; and at this point, the first voltage Vdd is transmitted to the fourth node N4 through the fifth transistor T5, a gate-source voltage of the driving transistor T3 is Vgs=$V_{N1}$−Vdd=Data+Vth−Vdd, and $V_{N1}$ is the voltage of the first node N1. A current Ion passing through the driving transistor T3 is calculated with a formula below:

$$\text{Ion} = K \times (Vgs - Vth)^2 = K \times (\text{Data} - Vdd)^2,$$

$$K = 0.5\mu_n Cox \frac{W}{L},$$

where $\mu_n$ is a channel mobility of the driving transistor, Cox is a channel capacitance of the driving transistor per unit area, W and L are respectively a channel width and a channel length of the driving transistor, and Vgs is the gate-source voltage of the driving transistor (difference between the gate voltage and the source voltage of the driving transistor).

Thus, the current Ion passing through the driving transistor T3 is not related to the threshold voltage of the driving transistor T3. That is, the threshold voltage of the driving transistor is compensated, which improves evenness of light emission of the organic light-emitting diode.

With reference to FIG. 7, an embodiment of the present disclosure provides a driving method comprising the above-described six stages used in the pixel circuit 400 of FIG. 4. The driving method comprises the following operations:

In the pre-reset stage t1, the reset signal. Reset is at a high level; the scanning signal gate is at a high level; the first transistor T1, the second transistor T2, the fourth transistor T4 and the seventh transistor T7 are turned off, and the light emission control line EM is at a high level. At this point, the fifth transistor T5 and the sixth transistor T6 are turned off.

The pre-reset stage t1 provides a pixel circuit stabilization process, to prevent the circuit from being abnormal and to prepare for the reset stage.

In the reset stage t2, the reset signal Reset is at a low level, the first transistor T1 and the seventh transistor T7 are turned on, the scanning signal Gate is maintained at the high level, the second transistor T2 and the fourth transistor T4 are turned off, the light emission control signal EM are maintained at the high level, the fifth transistor T5 and the sixth transistor T6 are turned off, and the initial voltage Vini is transmitted to the first node N1 through the first transistor T1 to reset the first node N1. At the same time, the initial voltage Vini is transmitted to the second node N2 through the seventh transistor T7, to reset the second node N2, that is, to discharge an anode of the organic light-emitting diode, so as to avoid abnormal light emission of the organic light-emitting diode.

In the signal write preparation stage t3, the reset signal Reset is at a high level, the first transistor T1 and the seventh transistor T7 are turned off, and the scanning signal Gate and the light emission control signal EM are maintained at the high level. The first transistor T1, the second transistor T2 and the fourth transistor T4, the fifth transistor T5 and the sixth transistor T6 are turned off. The signal write preparation stage t3 provides a pixel circuit stabilization process, to prevent the circuit from being abnormal and to prepare for the data write and threshold compensation stage.

In the data write and threshold compensation stage t4, the reset signal Reset is maintained at the high level, the scanning signal Gate is at a low level, and at this point the second transistor T2 and the fourth transistor T4 are turned on, and the data signal Data is transmitted to the third node N3 through the fourth transistor T4; since the second transistor T2 is turned on, the gate electrode and the source electrode of the driving transistor T3 are connected with each other, causing the driving transistor T3 to form a diode structure; since at this point a potential of the first node N1 is the initial voltage Vini (for example, the low level) and the source electrode of the driving transistor T3 is connected with a high-level data signal Data, the driving transistor T3 is in a diode-turning-on state. Due to the threshold voltage of the driving transistor T3 itself being Vth, when the driving transistor T3 is turned on as the diode, the potential of the first node N1 becomes "Data+Vth", and then the driving transistor T3 maintains a turning-off state.

In the pre-emission stage t5, the reset signal Reset is maintained at the high level, the scanning signal Gate is at a high level, and at this point, and the storage capacitor Cst maintains a voltage at the first node N1 as "Data+Vth". The pre-emission stage t5 provides a pixel circuit stabilization process, to prevent the circuit from being abnormal.

In the light emission stage t6, the reset signal Reset and the scanning signal Gate are maintained at the high level; and at this point, the light emission control signal EM is at a low level, the fifth signal T5 and the sixth transistor T6 are turned on; and at this point, the first voltage Vdd is transmitted to the fourth node N4 through the fifth transistor T5, and a gate-source voltage of the driving transistor T3 is Vgs=$V_{N1}$−Vdd=Data+Vth−Vdd, and $V_{N1}$ is the voltage of the first node N1. A current Ion passing through the driving transistor T3 is calculated with a formula below: Ion=K×(Vgs−Vth)$^2$=K×(Data−Vdd)$^2$, and thus, the current Ion passing through the driving transistor T3 is irrelevant to the threshold voltage of the driving transistor T3. That is, the threshold voltage of the driving transistor is compensated, which improves evenness of light emission of the organic light-emitting diode.

In summary, in the pixel circuits provided by the present disclosure, a current output from the driving transistor T3 is proportional to a square of the voltage difference between the data signal and the first power line, and is irrelevant to the threshold voltage of the driving transistor T3 itself; and therefore, it is able to avoid mura of the organic light-emitting diode caused by the threshold voltage offset. Thus, a light-emitting display including the pixel circuit can have even and stable images. In the embodiments of the present disclosure, the seventh transistor T7 is also used in the circuit reset stage for discharging the anode of the organic light-emitting diode, so as to avoid abnormal light emission of the organic light-emitting diode. At the same time, in the embodiments of the present disclosure, the storage capacitor is connected with the independent and unaffected reference voltage, which ensures accuracy and stability of the data signal stored in the storage capacitor.

For example, the above description in the embodiments of the present disclosure is provided with the P-type transistors as an example, and the embodiments of the present disclosure may also be implemented with the N-type transistors as well.

Drawings of the embodiments of the present disclosure only refer to structures related with the embodiments of the present disclosure, and other structures may refer to a general design. In scenarios with no conflict, different embodiments of the present disclosure and different features in the embodiments may be combined with each other.

What are described above is related to the illustrative embodiments of the disclosure only and not limitative to the scope of the disclosure; any changes or replacements easily for those technical personnel who are familiar with this technology in the field to envisage in the scopes of the disclosure, should be in the scope of protection of the present disclosure. Therefore, the scopes of the disclosure are defined by the accompanying claims.

The present application claims the priority of the Chinese Patent Application No. 201610811616.6 filed on Sep. 8, 2016, which is incorporated herein by reference in its entirety as part of the disclosure of the present application.

The invention claimed is:
1. A pixel circuit, comprising:
a storage capacitor, including a first terminal and a second terminal, wherein the first terminal is connected with a first node, and the second terminal is connected with a reference voltage line to receive a reference voltage;
an organic light-emitting diode, including an anode and a cathode, wherein the anode is connected with a second node, and the cathode is connected with a second power line to receive a second voltage;
a driving transistor, including a gate electrode connected with the first node, a first electrode connected with a fourth node, and a second electrode connected with a third node, wherein the driving transistor is configured to control light emission of the organic light-emitting diode according to a voltage of the first node;
a first reset circuit, configured to supply an initial voltage to the first node in response to a reset signal;
a scanning circuit, configured to supply a data signal to the third node in response to a scanning signal;
a compensating circuit, configured to conduct the first node and the fourth node to supply a compensating voltage to the first node in response to the scanning signal, wherein the compensating voltage is a sum of the data signal and a threshold voltage of the driving transistor; and a light emission control circuit, configured to control the organic light-emitting diode to emit light in response to a light emission control signal, wherein the light emission control circuit is configured to supply a first voltage of a first power line to the first electrode of the driving transistor in response to the light emission control signal, and the first power line and the reference voltage line are provided separately.

2. The pixel circuit according to claim 1, wherein the light emission control circuit includes:
a first light emission control circuit, configured to supply the first voltage of the first power line to the fourth node in response to the light emission control signal; and
a second light emission control circuit, configured to conduct the third node and the second node in response to the light emission control signal.

3. The pixel circuit according to claim 1, wherein at least one of the first reset circuit, the scanning circuit, the compensating circuit and the light emission control circuit includes a transistor.

4. The pixel circuit according to claim 3, wherein:
the first reset circuit includes a first transistor, a first electrode of the first transistor is connected with an initial signal line to receive the initial voltage, a gate electrode of the first transistor is connected with a reset signal line to receive the reset signal, and a second electrode of the first transistor is connected with the first node;
the compensating circuit includes a second transistor, a first electrode of the second transistor is connected with the first node, a gate electrode of the second transistor is connected with a scanning signal line to receive the scanning signal, and a second electrode of the second transistor is connected with the fourth node; and
the scanning circuit includes a fourth transistor, a first electrode of the fourth transistor is connected with a data signal line to receive the data signal, a gate electrode of the fourth transistor is connected with the scanning signal line to receive the scanning signal, and a second electrode of the fourth transistor is connected with the third node.

5. A pixel circuit, comprising:
a storage capacitor, including a first terminal and a second terminal, wherein the first terminal is connected with a first node, and the second terminal is connected with a reference voltage line to receive a reference voltage;
an organic light-emitting diode, including an anode and a cathode, wherein the anode is connected with a second node, and the cathode is connected with a second power line to receive a second voltage;
a driving transistor, including a gate electrode connected with the first node, a first electrode connected with a fourth node, and a second electrode connected with a third node, wherein the driving transistor is configured to control light emission of the organic light-emitting diode according to a voltage of the first node;
a first reset circuit, configured to supply an initial voltage to the first node in response to a reset signal;
a scanning circuit, configured to supply a data signal to the third node in response to a scanning signal;
a compensating circuit, configured to conduct the first node and the fourth node to supply a compensating voltage to the first node in response to the scanning signal, wherein the compensating voltage is a sum of the data signal and a threshold voltage of the driving transistor; and a light emission control circuit, configured to control the organic light-emitting diode to emit light in response to a light emission control signal, wherein the light emission control circuit is configured to supply a first voltage of a first power line to the first electrode of the driving transistor in response to the light emission control signal, and the first power line and the reference voltage line are provided separately;
the light emission control circuit includes:
a first light emission control circuit, configured to supply the first voltage of the first power line to the fourth node in response to the light emission control signal; and
a second light emission control circuit, configured to conduct the third node and the second node in response to the light emission control signal;
the first light emission control circuit includes a fifth transistor, a first electrode of the fifth transistor is connected with the first power line to receive the first voltage, a gate electrode of the fifth transistor is connected with a light emission control signal line to receive the light emission control signal, and a second electrode of the fifth transistor is connected with the fourth node; and
the second light emission control circuit is a sixth transistor, a first electrode of the sixth transistor is connected with the third node, a gate electrode of the sixth transistor is connected with the light emission control signal line to receive the light emission control signal, and a second electrode of the sixth transistor is connected with the second node.

6. The pixel circuit according to claim 1, further comprising a second reset circuit, configured to supply the initial voltage to the second node in response to the reset signal.

7. The pixel circuit according to claim 6, wherein at least one of the first reset circuit, the scanning circuit, the second reset circuit and the compensating circuit includes a transistor; and the light emission control circuit includes a fifth transistor and a sixth transistor.

8. The pixel circuit according to claim 7, wherein:
the first reset circuit includes a first transistor, a first electrode of the first transistor is connected with an initial signal line to receive the initial voltage, a gate electrode of the first transistor is connected with a reset signal line to receive the reset signal, and a second electrode of the first transistor is connected with the first node;
the compensating circuit includes a second transistor, a first electrode of the second transistor is connected with the first node, a gate electrode of the second transistor is connected with a scanning signal line to receive the scanning signal, and a second electrode of the second transistor is connected with the fourth node;
the scanning circuit includes a fourth transistor, a first electrode of the fourth transistor is connected with a data signal line to receive the data signal, a gate electrode of the fourth transistor is connected with the scanning signal line to receive the scanning signal, and a second electrode of the fourth transistor is connected with the third node;
the second reset circuit includes a seventh transistor, a first electrode of the seventh transistor is connected with the initial signal line to receive the initial voltage, a gate electrode of the seventh transistor is connected with the reset signal line to receive the reset signal, and a second electrode of the seventh transistor is connected with the second node;

a first electrode of the fifth transistor is connected with the first power line to receive the first voltage, a gate electrode of the fifth transistor is connected with the light emission control signal line to receive the light emission control signal, and a second electrode of the fifth transistor is connected with the fourth node; and a first electrode of the sixth transistor is connected with the third node, a gate electrode of the sixth transistor is connected with the light emission control signal line to receive the light emission control signal, and a second electrode of the sixth transistor is connected with the second node.

9. The pixel circuit according to claim 8, wherein the first transistor, the second transistor, the driving transistor, the fourth transistor, the fifth transistor, the sixth transistor and the seventh transistor are all P-type transistors.

10. The pixel circuit according to claim 8, wherein the first transistor, the second transistor, the driving transistor, the fourth transistor, the fifth transistor, the sixth transistor and the seventh transistor are all thin film transistors.

11. A display panel, comprising the pixel circuit according to claim 1, the display panel further comprising:
the first power line, for supplying the first voltage;
a second power line, for supplying a second voltage;
the reference voltage line, a data signal line, a reset signal line, and a scanning signal line, wherein the data signal line and the reset signal line are arranged to extend across each other, the data signal line and the scanning signal line are arranged to extend across each other, and the reference voltage line is parallel to at least one of the data signal line, the reset signal line and the scanning signal line;
a scan driving circuit, configured to supply the scanning signal to a scanning signal line; and
a data driving circuit, configured to supply the data signal to a data signal line.

12. A display device, comprising the display panel according to claim 11.

13. A driving method of the pixel circuit according to claim 1, comprising a reset stage, a data write and threshold compensation stage and a light emission stage, wherein:

in the reset stage, a light emission control signal is set to a turning-off voltage, a reset signal is set to a turning-on voltage, a scanning signal is set to the turning-on voltage, and a data signal is set to an invalid data signal;

in the data write and threshold compensation stage, the light emission control signal is set to the turning-off voltage, the reset signal is set to the turning-off voltage, the scanning signal is set to the turning-on voltage, and the data signal is set to a valid data signal; and in the light emission stage, the light emission control signal is set to the turning-on voltage, the reset signal is set to the turning-off voltage, the scanning signal is set to the turning-off voltage, and the data signal is set to the invalid data signal.

14. The driving method according to claim 13, further comprising a pre-reset stage prior to the reset stage;
wherein in the pre-reset stage, the light emission control signal is set to the turning-off voltage, the reset signal is set to the turning-off voltage, the scanning signal is set to the turning-off voltage, and the data signal is set to the invalid data signal.

15. The driving method according to claim 13, further comprising a signal write preparation stage between the reset stage and the data write and threshold compensation stage;
wherein in the signal write preparation stage, the light emission control signal is set to the turning-off voltage, the reset signal is set to the turning-off voltage, the scanning signal is set to the turning-off voltage, and the data signal is set to the invalid data signal.

16. The driving method according to claim 13, further comprising a pre-emission stage between the data write and threshold compensation stage and the light emission stage;
wherein in the pre-emission stage, the scanning signal is set to the turning-off voltage, the reset signal is set to the turning-off voltage, the data signal is set to the invalid data signal, and the light emission control signal is set to the turning-off voltage.

17. The pixel circuit according to claim 1, wherein the second node is connected with the driving transistor through the third node.

* * * * *